United States Patent
de Ambroggi et al.

(10) Patent No.: US 7,355,468 B2
(45) Date of Patent: Apr. 8, 2008

(54) VOLTAGE GENERATOR CIRCUIT, METHOD FOR PROVIDING AN OUTPUT VOLTAGE AND ELECTRONIC MEMORY DEVICE

(75) Inventors: Luca de Ambroggi, Munich (DE); Giacomo Curatolo, Unterhaching (DE)

(73) Assignee: Infineon Technologies Flash GmbH & Co. KG, Dresden (DE)

(*) Notice: Subject to any disclaimer, the term of this patent is extended or adjusted under 35 U.S.C. 154(b) by 0 days.

(21) Appl. No.: 11/473,519

(22) Filed: Jun. 23, 2006

(65) Prior Publication Data
US 2007/0296486 A1  Dec. 27, 2007

(51) Int. Cl.
*G05F 1/10* (2006.01)
(52) U.S. Cl. .................................... 327/536
(58) Field of Classification Search ............. 327/390, 327/535, 536, 537
See application file for complete search history.

(56) References Cited

U.S. PATENT DOCUMENTS

| | | | |
|---|---|---|---|
| 5,537,072 A | 7/1996 | Canclini | |
| 6,473,321 B2 | 10/2002 | Kishimoto et al. | |
| 6,614,292 B1 | 9/2003 | Chung et al. | |
| 6,700,436 B2 * | 3/2004 | Shim | 327/536 |
| 6,952,116 B2 * | 10/2005 | Cordoba | 326/88 |

* cited by examiner

*Primary Examiner*—Jeffrey Zweizig
(74) *Attorney, Agent, or Firm*—Slater & Matsil, L.L.P.

(57) ABSTRACT

A voltage generator circuit provides an output voltage that is higher than an input voltage. The voltage generator circuit includes an input terminal receiving the input voltage, and an output terminal providing the output voltage. A pre-charge element is coupled between the input terminal and the output terminal, and a capacitance circuit is coupled to the input terminal and to the output terminal.

23 Claims, 9 Drawing Sheets

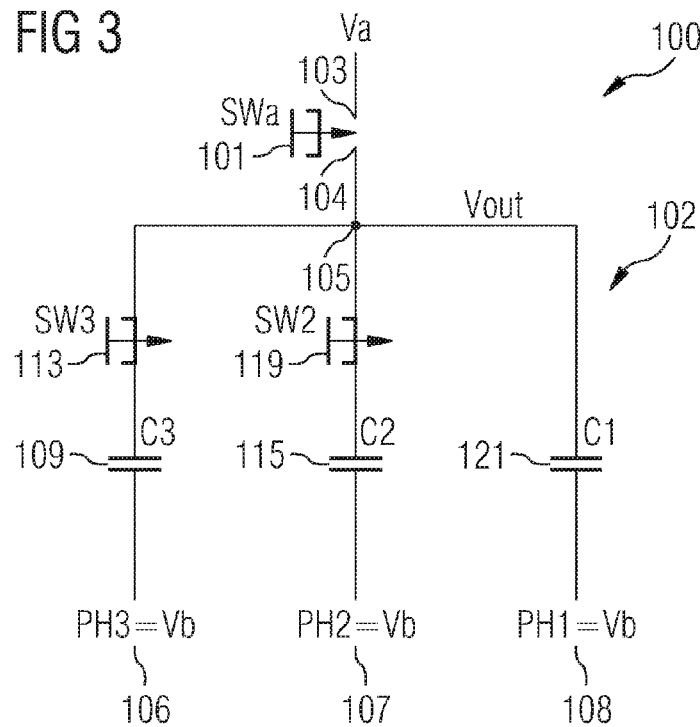
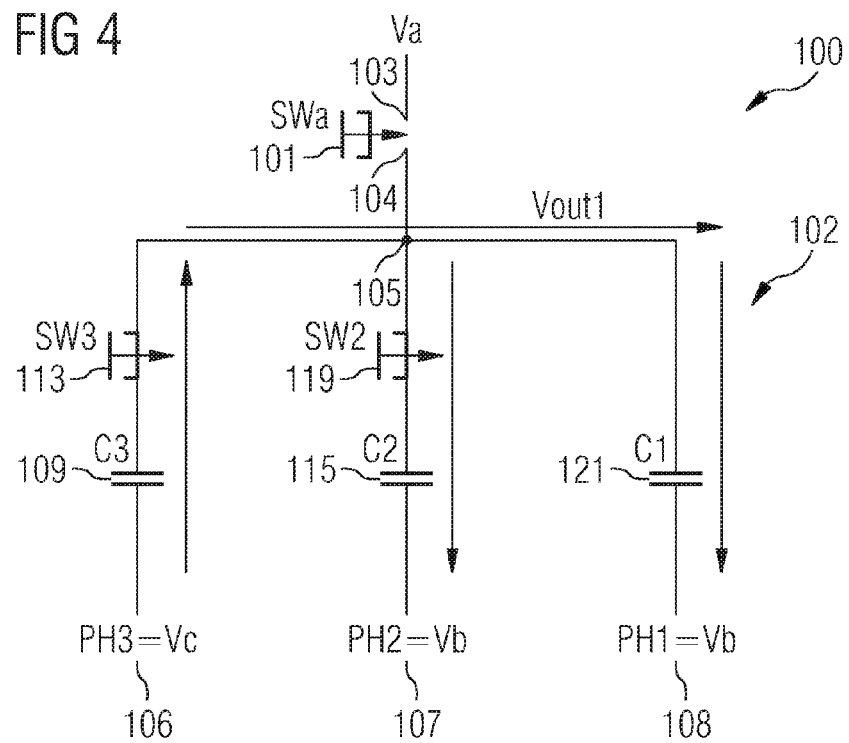

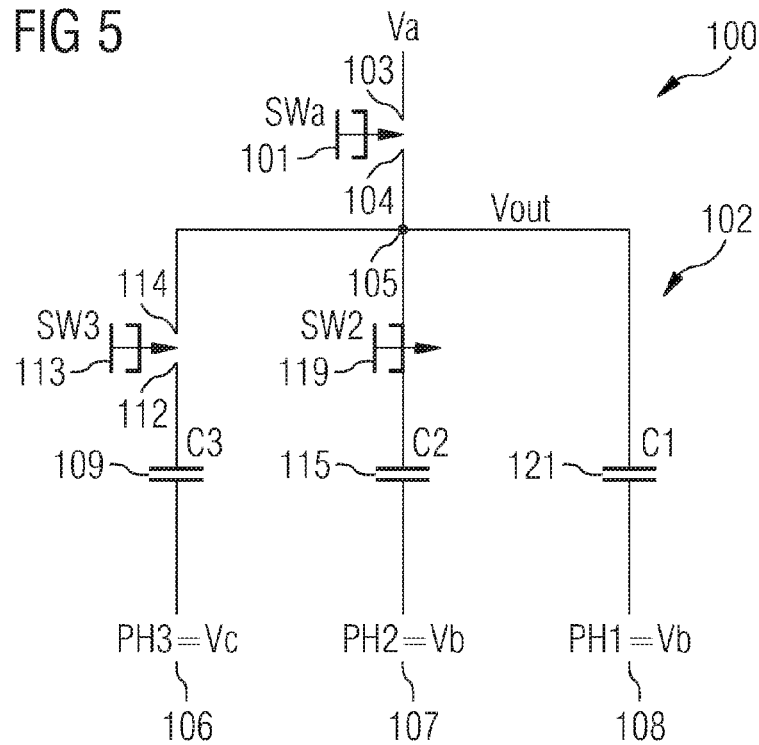
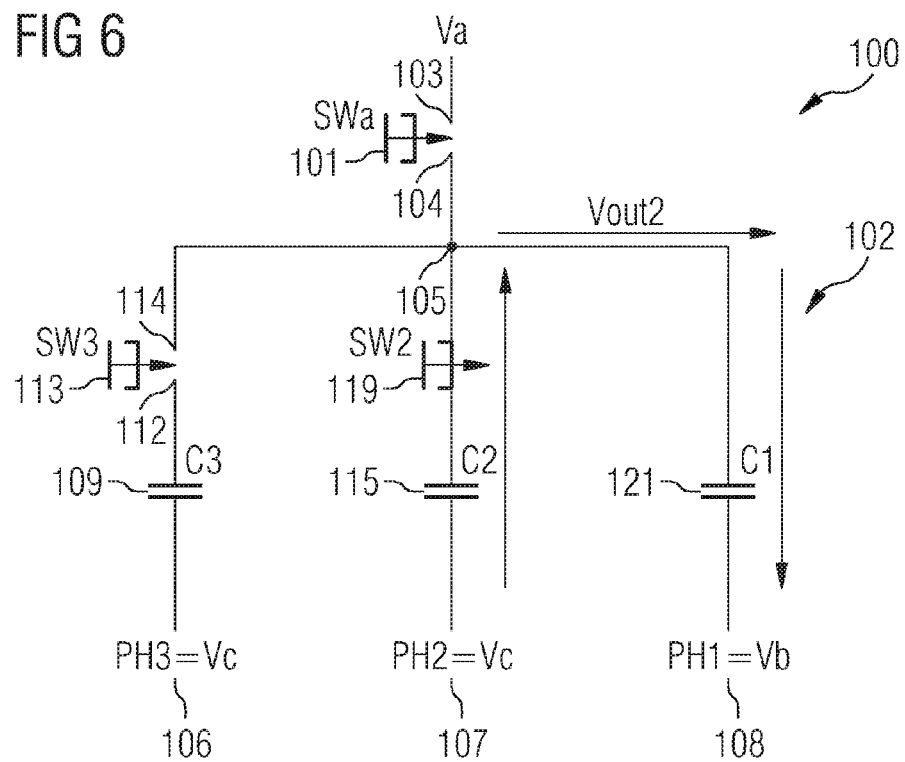

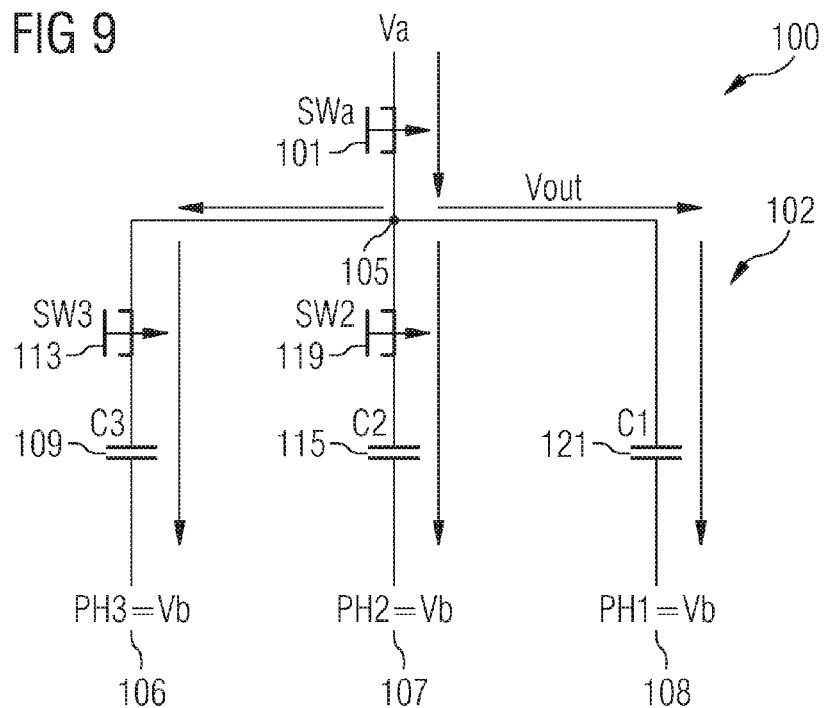
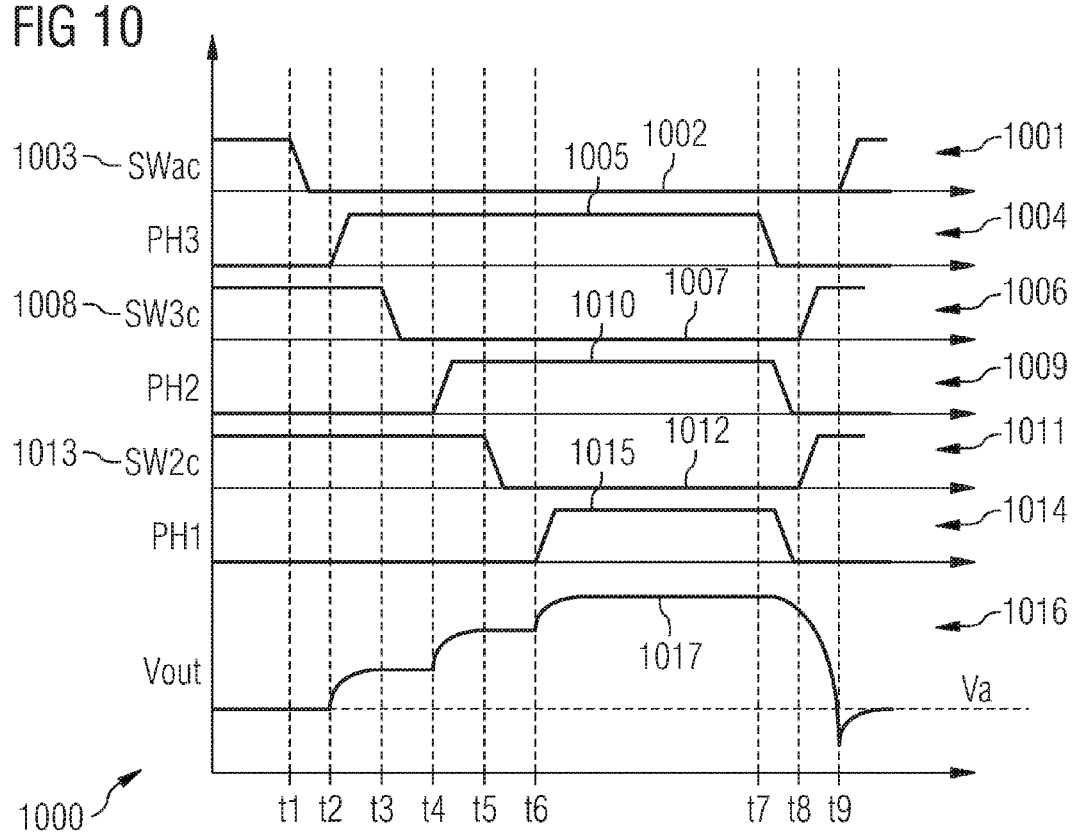

VOLTAGE GENERATOR CIRCUIT, METHOD FOR PROVIDING AN OUTPUT VOLTAGE AND ELECTRONIC MEMORY DEVICE

TECHNICAL FIELD

The invention relates to a voltage generator circuit, a method for providing an output voltage and to an electronic memory device.

BACKGROUND

In many integrated circuit applications, for example in many non-volatile memory products such as an Erasable Programmable Read Only Memory (EPROM), a Flash Memory, an Electronically Erasable Programmable Read Only Memory (EEPROM), etc., there is the need to have different positive and negative voltages higher than the external Power Supply Voltage ($V_{CC}$) to permit all kinds of operation that the integrated circuit application, for example a memory system, requires. Examples of such an operation is the reading of data stored in the memory system, programming of data into the memory system and erase data that are stored in the memory system.

Each one of these operations requires different voltage levels in order to bias different electronic circuits, positive voltages as well as negative voltages.

There are many realizations of a voltage generator circuit that provides a higher voltage than the external power supply voltage. Most of them use several stages based on capacitive elements.

The optimization of high voltage generators is related to area occupation, efficiency (with regard to power consumption/output power), voltage gain ($V_{out}/V_{CC}$) reliability and current capability.

With regard to the area occupation, the capacitance area has to be taken into account, that is the area used for capacitances in the integrated circuits. As a generic example an ideal two-plate capacitance is considered, which has a capacitance value according to $$C = \varepsilon \frac{A}{d}. \tag{1}$$

In common semiconductor technology, the capacitance has the parallel plates been developed vertically (d), while the area (A) is designed horizontally d and $\varepsilon$ are fixed, that is predetermined by the technology process used for manufacturing the integrated circuit. Therefore, in order to increase the capacitance value of the capacitance, the area A should be increased what obviously has a severe impact on the die area needed for the capacitance area.

Furthermore, areas are required in the integrated circuit for different circuitries, for example for high voltage switches, a phase generator circuit or a pre-charge circuit.

With regard to the efficiency as optimization criterion, wherein the efficiency is defined by the power that is needed to supply all the stages of the integrated circuit from $V_{CC}$, that is the external power supply voltage and the power that is provided to the load of the voltage generator circuits, that is the output power. The power spent to charge parasitic capacitances like for charging junction capacitances can be relevant for the efficiency.

The voltage gain is defined as the output voltage from the voltage generator circuit divided by the external power supply voltage ($V_{CC}$). For some applications, the voltage gain is more important than the above and the following mentioned optimization criteria (pure capacitive load).

With regard to the reliability, care should be taken in the implementation to avoid forward biased junctions that can trigger latch up, current injection due to high voltage change, oxide and junction stress due to overvoltage.

Current capability is to be understood as the maximum current capability at the regulated voltage that for the typical implementation is determined according to the following formula:

$$I = C \cdot \Delta V \cdot f. \tag{2}$$

The comparison will be carried out for a normalized frequency and capacitance according to the following equation:

$$I_{capability} = \frac{I_{out}}{C_{tot} \cdot f}. \tag{3}$$

FIG. 14A shows an example of a common charge pump circuit 1400 as a known voltage generator circuit. The charge pump circuit 1400 includes a series of diodes $D_1$, $D_2$, $D_3$, $D_{OUT}$ and capacitances $C_{T1}$, $C_{T2}$, $C_{TN}$, $C_{STORE}$. The diodes $D_1$, $D_2$, $D_3$, $D_{OUT}$ are required to establish the direction of the current flow, while the main task of the capacitances $C_{T1}$, $C_{T2}$, $C_{TN}$, $C_{STORE}$ is to accumulate the charge that is then transferred from one capacitance to the next capacitance, by driving the capacitances with the phase signals CK and CK# (see FIG. 14B).

Two physical phenomena are the basis for the operation of the charge pump circuit 1400. The first physical phenomena is related to the basic capacitance characteristic: the voltage across the capacitance cannot change instantaneously. The second physical phenomenon is the so-called charge sharing phenomenon, which takes place when two capacitances pre-charged at different voltages are connected. The final voltage of this connected node between the two capacitances depends on the initial voltages of the two capacitances as well as on their relative dimensions.

The operation mode of the charge pump circuit 1400 includes a pre-charge phase and an operation phase. Within the pre-charged phase, all nodes $S_i$ that is $S_1$, $S_2$, $S_N$ are initially pre-charged to the external power supply voltage $V_{DD}$. After the pre-charge phase, the charge pump phase starts with the power up of the CK signal and the CK# signal, thereby beginning to charge the start and to transfer the charge.

When the CK signal goes from the ground potential to the external power supply voltage $V_{DD}$ (time instant $t_1$ in FIG. 14B), the first node $S_1$ becomes equal to approximately $2*V_{DD}$. At this point, a portion of the charge previously stored in the first capacitance $C_{T1}$ is transferred to the second capacitor $C_{T2}$. The transfer of the charge stops ideally when the voltage of the second node $S_2$ is equal to the voltage of the first node $S_1$. The first diode $D_1$ prevents the charge from going back to the supply of the circuit, for ensuring the charge to go into the second capacitor $C_{T2}$. Thus, the voltage at the second capacitor $C_{T2}$ rises.

When the CK signal goes from the power supply voltage $V_{DD}$ to ground potential (time instant $t_2$ in FIG. 14B), the CK# signal rises from the ground potential to the power supply voltage $V_{DD}$ and the second capacitance $C_{T2}$ then transfers a portion of its stored charge to the third capacitance $C_{TN}$, thereby increasing the voltage at the third capacitance $C_{TN}$. At the same time, the first capacitance $C_{T1}$ that partially discharged during the previous phase is recharged to the value of the power supply voltage $V_{DD}$.

It should be noted that the voltage that is transferred from one capacitance to the next capacitance in addition to the voltage of the previous capacitance decreases from node to node with the same value of the capacitances.

Therefore, the voltage of the output node continues to increase by an increment that becomes smaller and smaller until the output voltage $V_{out}$ reaches the value of $(V_{DD}+n*V_{DD})$, wherein n is equal to the number of stages of the charge pump circuit 1400, while the internal node voltages reach a maximum value of $(V(S_n)=V_{DD}+n*V_{DD})$. As soon as these voltages are reached, no further charge transfer across the diodes takes place.

In this context, it should be mentioned that at the charge pump phase, all capacitances are always provided with a respective external voltage, either the voltage coming from the external input terminal and thus the external pulse apply voltage $V_{DD}$ or with the CK signal or the CK# signal. The CK signal and the CK# signal are alternating signals that are inverse to each other.

The charge pump circuit 1400 can theoretically increase the input voltage by the factor $n*V_{DD}$, but it takes a long time and a lot of clock cycles in order to increase the input voltage. Furthermore, usually a rather complex logic for controlling the charge pump circuit 1400 is required and in addition, a clock circuit is required to provide the CK signal and its inverse signal, namely the CK# signal.

FIG. 15A illustrates another voltage generator circuit, which is also called a voltage boosting circuit 1500. The boosting circuit 1500 includes a boost capacitance $C_{BOOST}$ and a load capacitance $C_{LOAD}$, wherein a first node of the boost capacitance $C_{BOOST}$ and a first node of the load capacitance $C_{LOAD}$ are connected with each other at a node BN. A first source/drain region of a PMOS field effect transistor 1501 is also coupled to the node BN, the second source/drain region of the PMOS field effect transistor 1501 is coupled to the power supply voltage $V_{DD}$. The gate region of the PMOS field effect transistor 1501 receives the signal A (see FIG. 15B).

The second node of the boost capacitance $C_{BOOST}$ is coupled to the output inverter 1502, which receives the signal B at its input (see FIG. 15C).

In the following, the working principal of the boosting circuit 1500 will be described in detail.

At the beginning, the boost capacitance $C_{BOOST}$ and the load capacitance $C_{LOAD}$ are pre-charged to the power supply voltage $V_{DD}$ via the PMOS field effect transistor 1501.

When the boost of the node BN is required, the PMOS field effect transistor 1501 is turned off and then the second signal B is driven low. In this way, the lower plate of the boost capacitance $C_{BOOST}$ is biased at a voltage equal to the power supply voltage $V_{DD}$. Since the node BN is isolated, its potential can be calculated by charge conservation. The charge $Q_i$ that is present on the pre-charge can be written as $$Q_i = (C_{BOOST} + C_{LOAD}) \cdot V_{DD}. \quad (4)$$

The final charge that is the charge when the boost has occurred is equal to $$Q_f = C_{BOOST} \cdot (V_{BN} - V_{DD}) + C_{LOAD} \cdot V_{BN}. \quad (5)$$

By imposing $Q_i = Q_f$, it follows that the value of the potential on node BN after the boost operation is equal to $$V_{BN} = V_{DD} + \frac{C_{BOOST}}{C_{BOOST} + C_{LOAD}} \cdot V_{DD}. \quad (6)$$

FIG. 15D shows the time schedule of the potential at node BN.

The boosting circuit 1500 is limited in its capability of the maximum achievable voltage gain, that is the boosting circuit 1500 can increase the output voltage up to twice the input voltage if the input voltage is the external power supply voltage $V_{DD}$ and the boost voltage $V_{BOOST}$.

What is therefore needed is an improved voltage generator circuit architecture and a corresponding method for providing an output voltage.

SUMMARY OF THE INVENTION

In one embodiment of the invention, a voltage generator circuit provides an output voltage that is higher in absolute value than an input voltage of the voltage generator circuit. The voltage generator circuit includes an input terminal receiving the input voltage, an output terminal providing the output voltage, a pre-charge element being connected between the input terminal and the output terminal, a capacitive circuit connected to the input terminal and to the output terminal, and a current pass and pre-charge element controller. The capacitance circuit has a first capacitance, a first capacitance current pass element being connected between the output terminal and a first node of the first capacitance, a second capacitance, a second capacitance current pass element being connected between the output terminal and a first node of the second capacitance and a third capacitance, a first node of which is coupled to the output terminal. The current pass and pre-charge element controller is set up such that in a pre-charge phase, the pre-charge element and the capacitance current pass elements are closed. In a voltage shifting phase, the pre-charge element is opened and the capacitance current pass elements are controlled such that they are sequentially opened such that charge on the capacitances is transferred to a predetermined capacitance of the capacitance circuit, which then provides the output voltage, wherein, before a capacitance current pass element is opened, a respective capacitance, the first node of which is connected to the capacitance current pass elements to be opened, is provided with a boosted voltage at its second node.

These and other features of the invention will be better understood when taken in view of the following drawings and a detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 illustrates the capacitance circuit in accordance with one embodiment of the present invention in a state, in which a pre-charge switching element is opened;

FIG. 4 illustrates the capacitance circuit in accordance with one embodiment of the present invention in a first boost phase;

FIG. 5 illustrates the capacitance circuit in accordance with one embodiment of the present invention in a second boost phase;

FIG. 6 illustrates the capacitance circuit in accordance with one embodiment of the present invention in a third boost phase;

FIG. 9 illustrates the capacitance circuit in accordance with one embodiment of the present invention in a sixth boost phase;

FIG. 10 illustrates a timing diagram showing the signal flows in accordance with one embodiment of the present invention;

DETAILED DESCRIPTION OF ILLUSTRATIVE EMBODIMENTS

Figure 1:
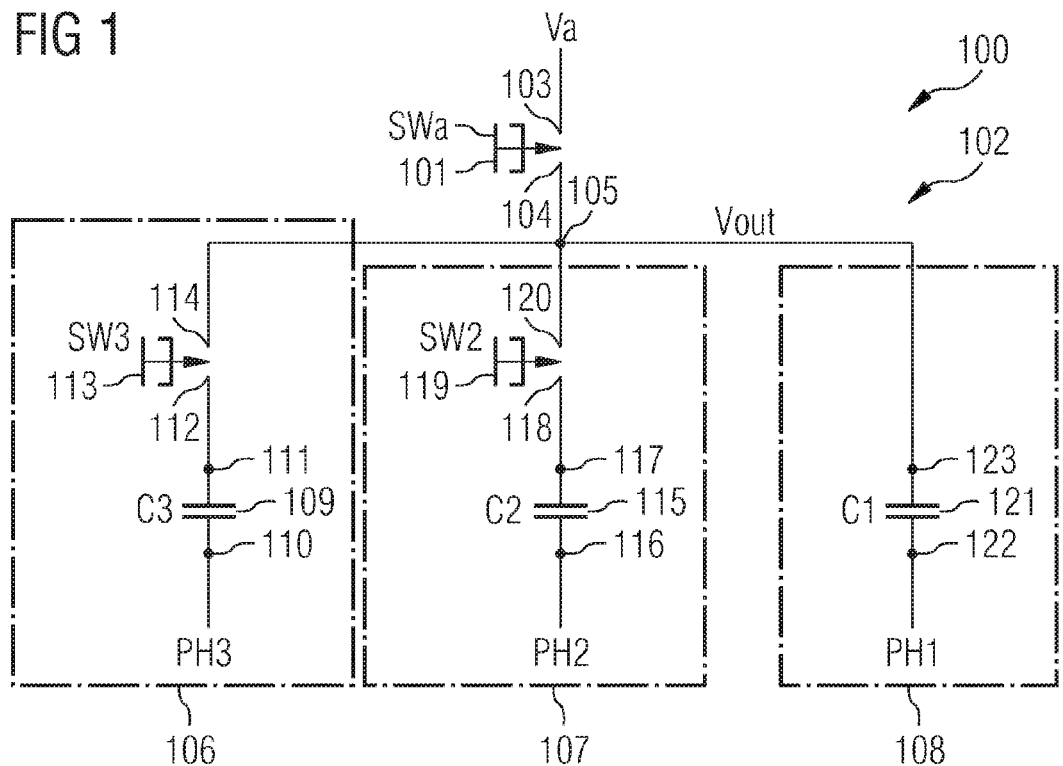
FIG. 1 illustrates a capacitor circuit in accordance with one embodiment of the present invention in its initial state.

In one embodiment of the invention a voltage generator circuit architecture provides an output voltage that, in absolute value, is higher than the input voltage that is input to the voltage generator circuit, wherein the input voltage usually is a lower power supply voltage. The created output voltage could then be used to supply internally many components of a semiconductor integrated system, such as a memory, for example one or more components of a non-volatile memory device.

In one embodiment of the invention, the capacitance circuit further includes at least a fourth capacitance and at least a third capacitance current pass element being connected between the output terminal and a first node of the fourth capacitance. The capacitances may be designed to have the same capacitance value. Furthermore, the capacitance may be designed such that at least some of them have different capacitance values.

In accordance with another embodiment of the invention, the pre-charge element is a pre-charge switching element.

In accordance with another embodiment of the invention, the pre-charge element includes at least one transistor.

In one embodiment of the invention, the pre-charge element includes at least one field effect transistor, at least one transmission gate or at least one diode.

In one embodiment of the invention, the pre-charge element includes at least one metal oxide semiconductor field effect transistor, e.g., at least one p-channel metal oxide semiconductor field effect transistor.

In one embodiment of the invention, at least one of the capacitance current pass elements is a capacitance switching element.

In another embodiment of the invention, at least one of the capacitance current pass elements includes at least one transistor, at least one transmission gate or at least one diode.

In one embodiment of the invention, at least one of the capacitance current pass elements includes at least one field effect transistor, e.g., at least one metal oxide semiconductor field effect transistor, e.g., at least one p-channel metal oxide semiconductor field effect transistor.

In one embodiment of the invention, a first level shifter circuit is connected between the current pass and pre-charge element controller and the first capacitance current pass element.

Furthermore, a second level shifter circuit may be connected between the current pass and pre-charge element controller and the second capacitance current pass element.

In one embodiment of the invention, a voltage generator circuit providing an output voltage that is higher than an input voltage is provided, the voltage generator circuit includes an input terminal receiving the input voltage, and an output terminal providing the output voltage. A pre-charge switching element is connected between the input terminal and the output terminal. A capacitance circuit is connected to the input terminal and to the output terminal, and includes a first capacitance, a first capacitance switching element connected between the output terminal and a first node of the first capacitance, a second capacitance, a second capacitance switching element connected between the output terminal and a first node of the second capacitance, and a third capacitance, a first node of which is coupled to the output terminal. A switching element controller is set up such that in a pre-charge phase, the switching elements are closed. In a voltage shifting phase, the pre-charge switching element is opened. The capacitance switching elements are controlled such that they are sequentially opened such that charge on the capacitances is transferred to a predetermined capacitance of the capacitance circuit, which then provides the output voltage, wherein, before a capacitance switching element is opened, a respective capacitance, the first node of which is connected to the capacitance switching element to be opened, is provided with a boost voltage at its second node.

In one embodiment of the invention, a method of providing an output voltage that is higher than a received input voltage is provided. The method is carried out in a voltage generator circuit. The voltage generator circuit includes an input terminal receiving the input voltage and an output terminal providing the output voltage. A pre-charge element is connected between the input terminal and the output terminal. A capacitance circuit is connected to the input terminal and to the output terminal, and includes a first capacitance, a first capacitance current pass element is connected between the output terminal and a first node of the first capacitance, a second capacitance, a second capacitance current pass element is connected between the output terminal and a first node of the second capacitance, and a third capacitance, a first node of which being coupled to the output terminal. The method includes in a pre-charge phase, closing the current pass elements and the pre-charge element, thereby pre-charging the capacitances with the input voltage. In a voltage shifting phase, opening the pre-charge element. Sequentially opening the capacitance current pass elements such that charge on the capacitances is transferred to a predetermined capacitance of the capacitance circuit, which then provides the output voltage, wherein, before a capacitance current pass element is opened, a respective capacitance, the first node of which is connected to the capacitance current pass element to be opened, is provided with a boost voltage at its second node.

In one embodiment of the invention, an electronic memory device is provided including a voltage generator circuit as described above. The electronic memory device may be configured as a non-volatile memory device.

In another embodiment of the invention, the electronic memory device is configured as a non-volatile memory device being selected from the group of a flash non-volatile memory device, a ferroelectric random access memory non-volatile memory device, a magnetic random access memory non-volatile memory device, a phase change memory non-volatile memory device, a conductive bridging random access memory non-volatile memory device, and an organic random access memory non-volatile memory device.

Furthermore, the electronic memory device may be configured as a floating gate flash non-volatile memory device or as a charge-trapping layer flash non-volatile memory device, for example as a nitride read only memory flash non-volatile memory device.

FIG. 1 shows a circuit diagram 100 illustrating a pre-charge switching element $SW_a$ 101 and a capacitance circuit 102 in accordance with a preferred embodiment of the invention.

A first node 103 of the pre-charge switching element $SW_a$ 101 is connected to a first voltage $V_a$ and a second node 104 of the pre-charge switching element 101 is connected to an output node 105 of the capacitance circuit 102, wherein the output voltage $V_{out}$ is provided at the output node 105. The first voltage $V_a$ is the input voltage of the voltage generator circuit that is to be increased by its absolute value by means of the voltage generator circuit as will be described later in detail.

The capacitance circuit 102 includes two switching stages 106, 107 and an output stage 108. Each switching stage 106, 107 includes a respective capacitance switching element and a capacitance being connected in series. In general, an arbitrary number of switching stages 106, 107 can be provided in the capacitance circuit. The switching stages 106, 107 are connected in parallel with each other.

In accordance with the capacitance circuit 102 shown in FIG. 1, the first switching stage 106 includes a first capacitance C3 109, the first node 110 of which and therewith a first capacitance plate thereof is connected to a first phase voltage PH3.

A second node 111 of the first capacitance 109 and therewith the second plate of the first capacitance 109 is connected to a first node 112 of a first capacitance switching element $SW_3$ 113, the second node 114 is connected with the output node 105.

Furthermore, the second switching stage 107 has a second capacitance $C_2$ 115, a first node of which 116 and therewith a first plate of which is connected to a second phase voltage PH2. A second node 117 of the second capacitance $C_2$ 115 and therewith a second plate of the second capacitance 115 is coupled to a first node 118 of a second capacitance switching element $SW_2$ 119, the second node 120 of which is also coupled to the output node 105.

The output stage 108 includes a third capacitance C1 121, a first node 122 of which and therewith a first plate of which is coupled to a third phase voltage PH1. A second node 123 of the third capacitance 121 and therewith a second plate of the third capacitance 121 is directly connected to the output node 105.

The first phase voltage PH3, the second phase voltage PH2, and the third phase voltage PH1 can be a voltage between a second voltage $V_b$ and a third voltage $V_c$. In the initial state, as shown in FIG. 1, all switching elements, that is the pre-charge switching element 101, the first capacitance switching element 113 and the second capacitance switching element 119 are opened in response to a respective control signal with the logical value "0", in other words, if a switching element is opened, no current flow is possible between the two nodes of the respective switching element.

The switching elements 101, 113, 119 will be closed if its respective control signal is logic "1", thereby shortening the respective three nodes of the switching elements 101, 113, 119.

The switching control scheme in accordance with the present invention will be described in detail hereinbelow. However, it should be mentioned that the exact sequence of the opening of the capacitance switching elements 113, 119 as described below is not mandatory, since it is only important that at least some of the capacitance switching elements are opened in a sequential manner such that charge on the capacitances is transferred to a predetermined capacitance of the capacitance circuit, which then provides the output voltage. Before a capacitance switching element is opened, a respective capacitance of the same switching stage is boosted, in other words, the first node of the capacitance of the respective switching stage is provided with a boost voltage.

As described above, in case that one or more additional switching stage(s) is/are provided in the capacitance circuit 102, for example at least a fourth capacitance is provided in the third switching stage together with a third capacitance switching element being connected between the output terminal 105 and a second node of the fourth capacitance, the first node of which is connected to a fourth phase voltage, etc.

The capacitances can be designed to have the same capacitance value, in accordance with this embodiment of the invention, the first capacitance $C_3$ 109 has the capacitance value of 1 pF, the second capacitance $C_2$ 115 has a capacitance value of 1 pF and the third capacitance $C_1$ 121 also has a capacitance value of 1 pF.

However, in an alternative embodiment, the capacitances of the capacitance circuit 102 can have different capacitance values.

As will be described herein below, the switching elements 101, 113, 119 can be transistors, for example field effect transistors, and therein by means of example metal oxide semiconductor field effect transistors (MOS field effect transistors).

The capacitance switching elements 113, 119 can be provided as p-channel metal oxide semiconductor field effect transistor (PMOS field effect transistors).

As will be described herein below, the first switching stage 106 can include a first level shifter circuit being connected between the switching element controller described herein below and the first capacitance switching element 113.

Furthermore, a second level shifter circuit can be provided in the second switching stage, wherein the second level shifter circuit can be connected between the switching element controller and the second capacitance switching element 119.

In general, each switching stage 106, 107 having a capacitance switching element 113, 119 can have a respectively assigned level shifter circuit for assuring a reliable opening and closing of the respective capacitance switching element.

Figure 2:
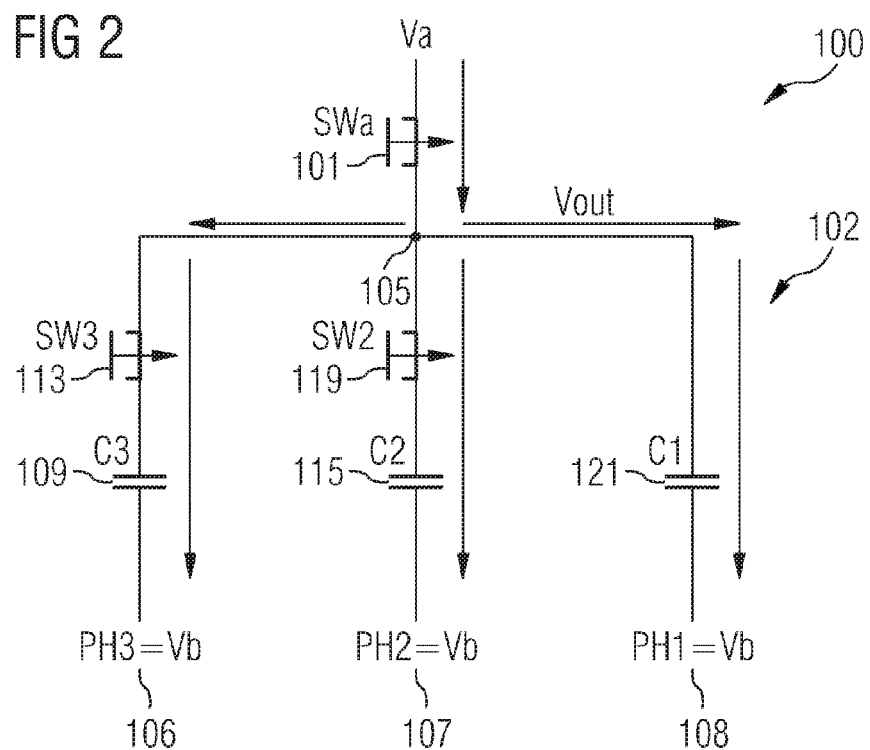
FIG. 2 illustrates the capacitance circuit in accordance with one embodiment of the present invention in a pre-charge phase.

In a pre-charge phase, all switching elements 101, 113, 119 are closed and thus, all capacitances 109, 115, 121 are pre-charged between the first voltage $V_a$ (that is the input voltage) and the second voltage $V_b$, wherein the second voltage $V_b$ is applied as all the phase voltages PH3, PH2, PH1. This pre-charge switching state is shown in FIG. 2.

At the end of the pre-charge phase, the pre-charge switching element $SW_a$ 101 is opened, while both capacitance switching elements 113, 119 remain closed and the three phase voltages PH3, PH2, PH1 are still coupled to the second voltage $V_b$. In this stage, the output node 105 is floating since no current is flowing at this stage (see FIG. 3).

Then, as shown in FIG. 4, in a first boosting phase, a third voltage $V_c$ is applied to the first node 110 of the first capacitance 109 while the second phase voltage PH2 and the first phase voltage PH3 remain the second voltage $V_b$. The switching elements 101, 113, 119 are not changed with regard to their switching states as compared to the switching states shown in FIG. 3 described above. In this way, the first capacitance $C_3$ 109 will charge the second capacitance $C_2$ 115 and the third capacitance $C_1$ 121 due to the so-called charge sharing effect. The final output voltage of this stage $V_{out1}$ will be $$V_{out1} = (V_a - V_b) + V_c \cdot \frac{C_3}{C_3 + C_2 + C_1} + V_b \cdot \frac{C_2 + C_1}{C_3 + C_2 + C_1}. \quad (7)$$

In a second boost phase, as shown in FIG. 5, the pre-charge switching element $SW_a$ 101 remains opened and the first capacitance switching element $SW_3$ 113 is also opened. The second capacitance switching element $SW_2$ 119 stays closed. Thus, the three phase voltages PH3, PH2, PH1 stay the same, since there is no current flow occurring in the capacitance circuit 102.

FIG. 6 shows the capacitance circuit 102 during a third boost phase, wherein the pre-charge switching element $SW_a$ 101 stays opened as well as the first capacitance switching element $SW_3$ 113 does. During the third boost phase, the third voltage $V_C$ is also applied to the second switching stage as the second phase voltage PH2. The rest of the capacitance circuit 102 remains unchanged as compared to the switching state of the capacitance circuit 102 shown in FIG. 5. Due to the switching states of the switching elements 101, 113, 119 and the respective phase voltages PH1, PH2, PH3 chosen in the third boost phase, the second capacitance $C_2$ 115 will charge the third capacitance $C_1$ 121 due to the charge sharing effect. (It is to be noted that no charge can flow to the first capacitance $C_3$ 109 due to the opened first capacitance switching element $SW_3$ 113.) The voltage $V_{out2}$ at the output node 105 at the end of the third boosting phase will be:

$$V_{out2} = (V_{out} - V_b) + V_c \cdot \frac{C_2}{C_2 + C_1} + V_b \cdot \frac{C_1}{C_2 + C_1}. \quad (8)$$

Figure 7:
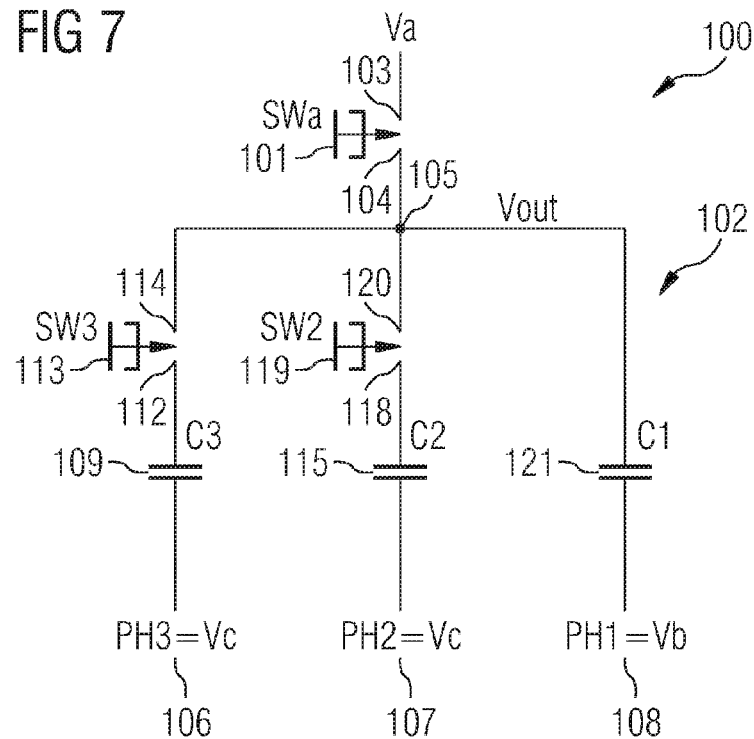
FIG. 7 illustrates the capacitance circuit in accordance with one embodiment of the present invention in a fourth boost phase.

In a fourth boosting phase, as shown in FIG. 7, the pre-charge switching element $SW_a$ 101 and the first capacitance switching element $SW_3$ 113 stay opened and the second capacitance switching element $SW_2$ 119 is opened. The phase voltages PH3, PH2, PH1 stay the same as compared with the third boosting phase shown in FIG. 6. Due to the switching states of the switching elements 101, 113, 119 and the voltages applied to the capacitance circuit 102, no current flow occurs in the capacitance circuit 102.

Figure 8:
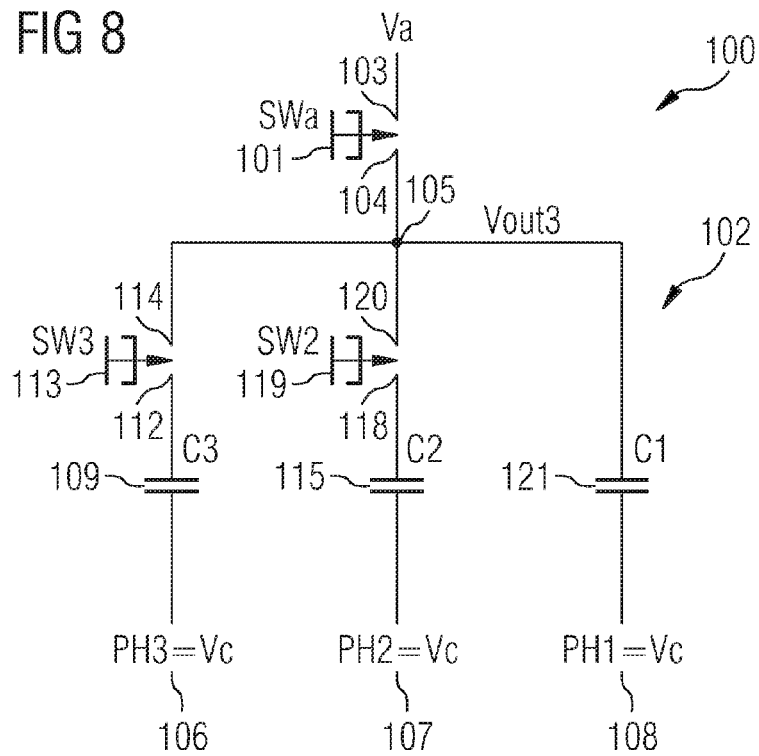
FIG. 8 illustrates the capacitance circuit in accordance with one embodiment of the present invention in a fifth boost phase.

As shown in FIG. 8, in a fifth boosting phase, the third phase voltage PH1 is set to the third voltage $V_c$ and the rest of the capacitance circuit 102 stays the same as compared to the switching state shown in FIG. 7. In this way, the third capacitance $C_1$ 121 will boost the output node 105 to a final output voltage $V_{out3}$ according to the following formula:

$$V_{out3} = V_{out2} + (V_c - V_b) \quad (9)$$

At this point, it will be possible to use this over voltage $V_{out3}$ to charge a load capacitance using the standard output stage of a charge pump circuit or for other purposes.

As shown in FIG. 9, as a final phase of one charge increase cycle, the phase voltages PH1, PH2, PH3 are again set to the second voltage $V_b$ after the first capacitance switching element $SW_3$ 113 and the second capacitance switching element $SW_2$ 119 has been closed again. Furthermore, the pre-charge switching element $SW_a$ 101 will also be closed. Thus, the capacitances 109, 115, 121 will be recharged to the first voltage $V_a$ and at this time instant, the capacitance circuit 102 is ready for another phase cycle like the one previously described.

FIG. 10 shows a timing diagram 1000 showing the signal flows of different control signals and voltages used in the above-described phases.

A first diagram 1001 shows the course 1002 of the pre-charge switching element control signal $SW_{ac}$ 1003 used for controlling the pre-charge switching element $SW_a$ 101, wherein the pre-charge switching element control signal $SW_{ac}$ 1003 is applied to the control terminal of the pre-charge switching element $SW_a$ 101. As described above, the pre-charge switching element control signal $SW_{ac}$ 1003 is set to high voltage (representing a closed pre-charged switching element) until a first time instant $t_1$, then it is set to low voltage, in the present embodiment of the invention, to zero volts (therewith closing the pre-charge switching element $SW_a$ 101) and remains at low voltage until a ninth time instant $t_9$, when it is set to high voltage again, thereby closing the pre-charge switching element $SW_a$ 101 again.

In a second diagram 1004, the course 1005 of the first phase voltage PH3 is shown, wherein the first phase voltage PH3 is set to low voltage, in the preferred embodiment of the invention to the second voltage $V_b$ (note that in this embodiment, the second voltage $V_b$ is chosen to be zero volts), is then risen to the third voltage $V_c$ at the second time instant $t_2$ and is set down to the second voltage $V_b$ again at the seventh time instant $t_7$.

A third diagram 1006 shows the course 1007 of the first capacitance switching element control signal $SW_{3c}$ 1008 controlling the first capacitance switching element $SW_3$ 113 and being applied to its control terminal. As described above, the first capacitance switching element control signal $SW_{3c}$ 1008 is at high voltage at the beginning, thereby closing the first capacitance switching element $SW_3$ 113. At the third time instant $t_3$ shown in FIG. 10, the first capacitance switching element control signal $SW_{3c}$ 1008 is set to low voltage, thereby opening the first capacitance switching element $SW_3$ 113, which is the beginning of the second boosting phase. The first capacitance switching element control signal $SW_{3c}$ 1008 remains at low voltage until an eighth time $t_8$ instant, at which it is risen again to high voltage level, thereby closing the first capacitance switching element $SW_3$ 113 again.

A fourth diagram 1009 shows the course 1010 of the second phase voltage PH2. The second phase voltage PH2 is set to the second voltage $V_b$ represented by low voltage in FIG. 10 until a fourth time instant $t_4$, is then risen to high voltage, that is according to the above-described embodiment of the invention, to the third voltage $V_c$ (third boosting phase) and remains on this voltage level until a time instant between the seventh time instant $t_7$ and the eighth time instant $t_8$, when it is set to the second voltage $V_b$ again.

A fifth diagram 1011 shows the course 1012 of a second capacitance switching element control signal $SW_{2c}$ 1013, which controls the second capacitance switching element $SW_2$ 119 and is applied to its control terminal. The second capacitance switching element control signal $SW_{2c}$ 1013 is set to high voltage level at the beginning and is kept at the high voltage level until a fifth time instant $t_5$, when it is set to low voltage level (this leads to the opening of the second capacitance switching element $SW_2$ 119 as shown in FIG. 7 in the fourth boosting phase), and remains on low level until the eighth time instant $t_8$, when it is risen to high voltage level again, thereby closing the second capacitance switching element $SW_2$ 119.

A sixth diagram 1014 shows the course 1015 of the third phase voltage PH1 which is set to low voltage level, according to the above-described embodiment of the invention to the second voltage $V_b$ until a sixth time instant $t_6$, when it is risen to high voltage level (according to the embodiment of the invention to the third voltage $V_c$) which is carried out during the fifth boost phase as shown in FIG. 8 and is kept at this voltage level until a time instant between the seventh time instant $t_7$ and the eighth time instant $t_8$, when it is reduced to the second voltage $V_b$ again.

A seventh diagram 1016 shows the course 1017 of the voltage $V_{out}$ that is present at the output node 105.

Figure 11:
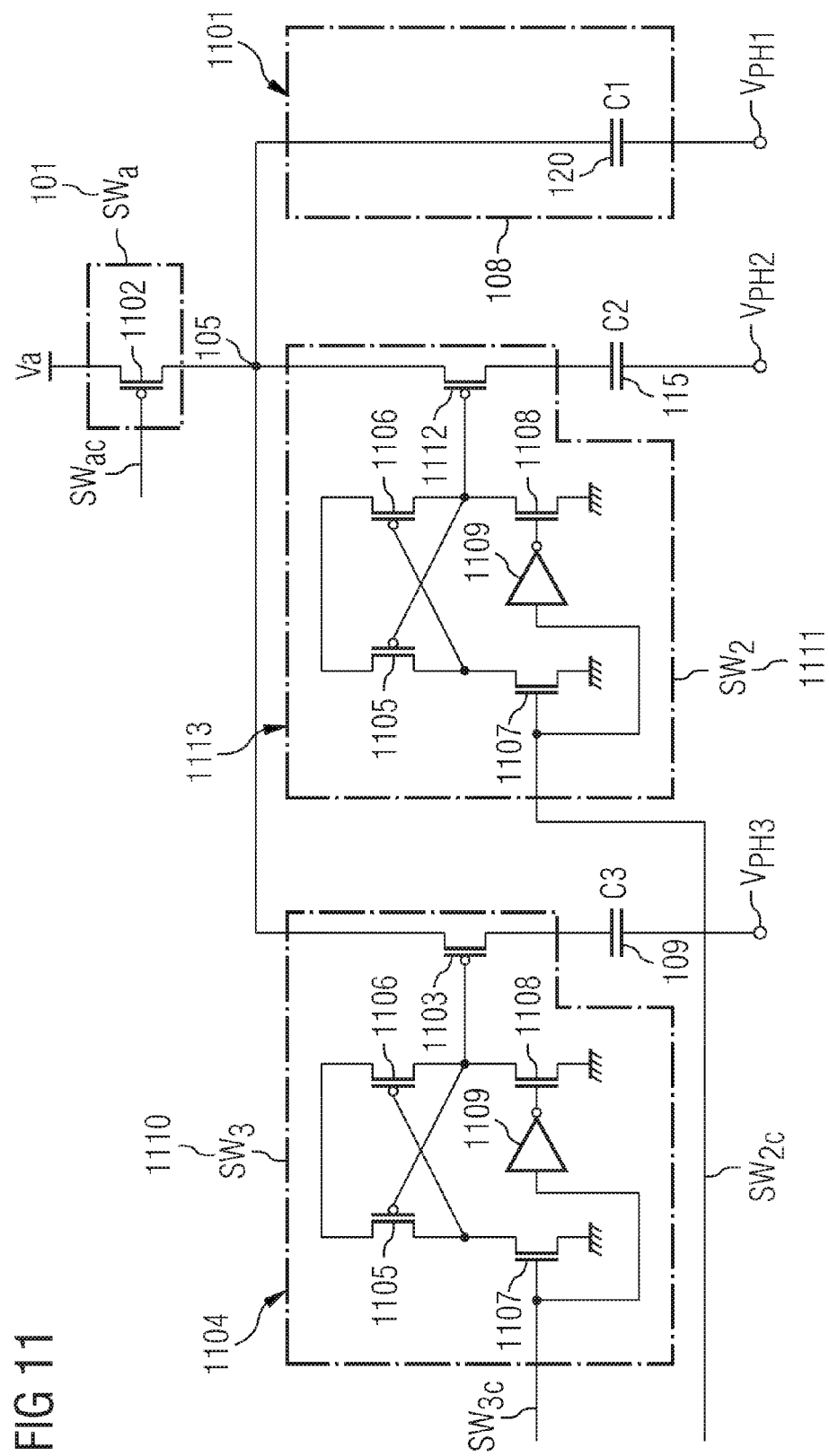
FIG. 11 illustrates an alternative embodiment of the capacitance circuit in accordance with one embodiment of the present invention.

FIG. 11 illustrates a second embodiment of the capacitance circuit 1101, wherein the structure of the output stage 108 is kept unchanged as well as the structure of the first capacitance 109 and the second capacitance 115. However, the second embodiment of the invention differs from the first embodiment of the invention in the realization of the switching elements.

For example, according to the embodiment shown in FIG. 11, the pre-charge switching element 101 is formed by means of a first PMOS field effect transistor 1102.

Furthermore, the first capacitance switching element 113 includes a second PMOS field effect transistor 1103 and, in order to ensure a secure opening and closing of this second PMOS field effect transistor 1103, a first level shifter circuit 1104 that is connected to the gate terminal of the second PMOS field effect transistor 1103. The first level shifter circuit 1104 includes two cross coupled additional PMOS field effect transistors 1105, 1106 and two NMOS field effect transistors 1107, 1108 being connected in series with the two cross-coupled PMOS field effect transistors 1105, 1106, respectively. Furthermore, the gate terminal of the first NMOS field effect transistor 1107 is coupled with the gate terminal of the second NMOS field effect transistor 1108 via an inverter 1109 and to the input of the first capacitance switching element 113 at which the first capacitance switching element control signal $SW_{3c}$ 1008 is applied.

The second switching stage is formed in a similar manner, that is the second capacitance switching element 1111 also includes a PMOS field effect transistor as switching element 1112 and a level shifter circuit 1113, which is structurally the same level shifter circuit as used in the first capacitance switching element 113 as described above.

Figure 12:
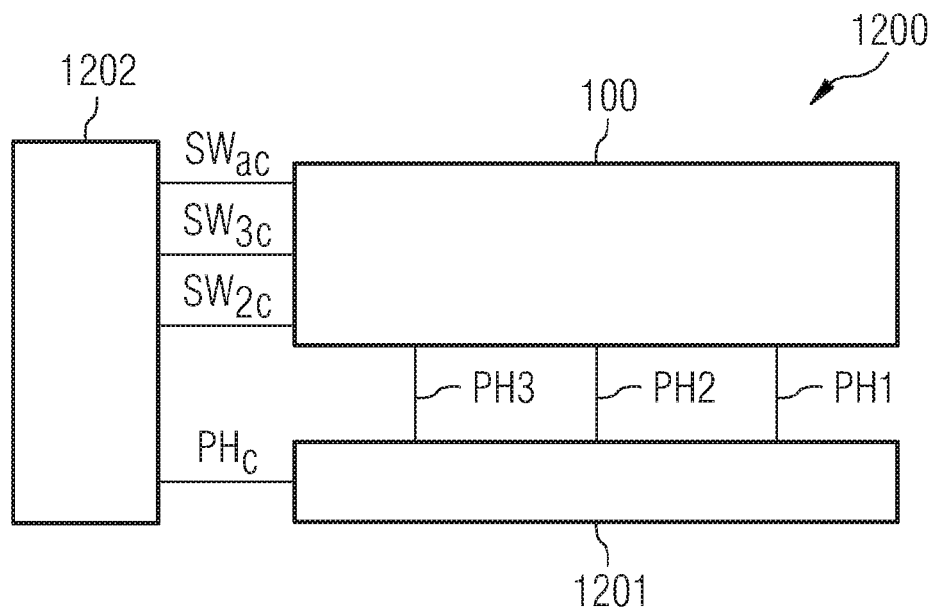
FIG. 12 illustrates a circuit including the voltage generator circuit in accordance one embodiment of with the present invention.

FIG. 12 shows a block diagram 1200 including the above-described block having the pre-charge switching element 101 and the capacitance circuit 102, a power supply regulator 1201 and a microprocessor 1202.

Generally speaking, the microprocessor 1202, which can be, in an alternative embodiment of the invention, a hard-wired logic or programmable logic, provides the control signals to the respective switching elements, namely the pre-charge switching element control signal $SW_{ac}$ 1003, the first capacitance switching element control signal $SW_{3c}$ 1008 and the second capacitance switching element control signal $SW_{2c}$ 1013 and provides them to the respective control inputs of the switching elements $SW_a$ 101, $SW_3$ 113, $SW_2$ 119.

Furthermore, a phase control signal PH including phase control signals PHc1, PHc2, PHc3 is provided to the power supply regulator 1201 and provides the power supply regulator 1201 with the respective commands so that the respective required phase voltages PH3, PH2, PH1 are applied to the capacitance circuit 102.

In an alternative embodiment of the invention, it should be mentioned that the control signals can be easily generated by means of an inverter chain, generally speaking by means of a chain of components ensuring a predetermined time delay in order to make sure that the capacitance switching elements $SW_3$ 113, $SW_2$ 119 are sequentially opened in order to transfer the charge stepwise to a predetermined "final" capacitance.

Figure 13:
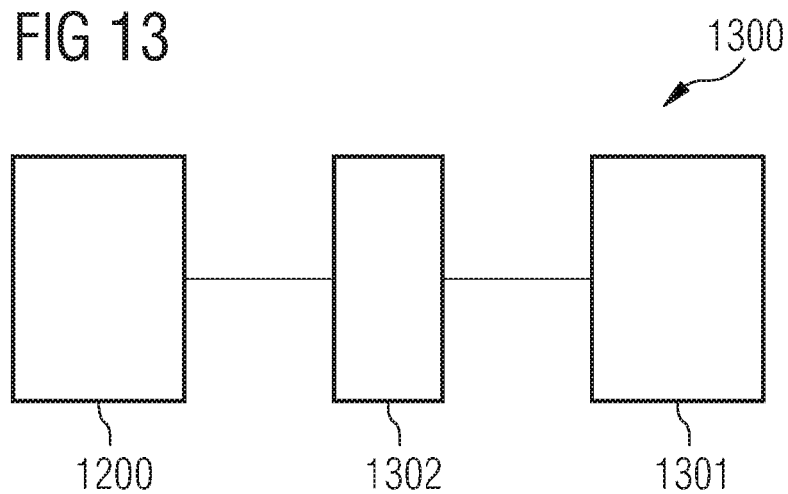
FIG. 13 illustrates a block diagram of a flash memory circuit in accordance with one embodiment of the present invention.
Figure 14A:
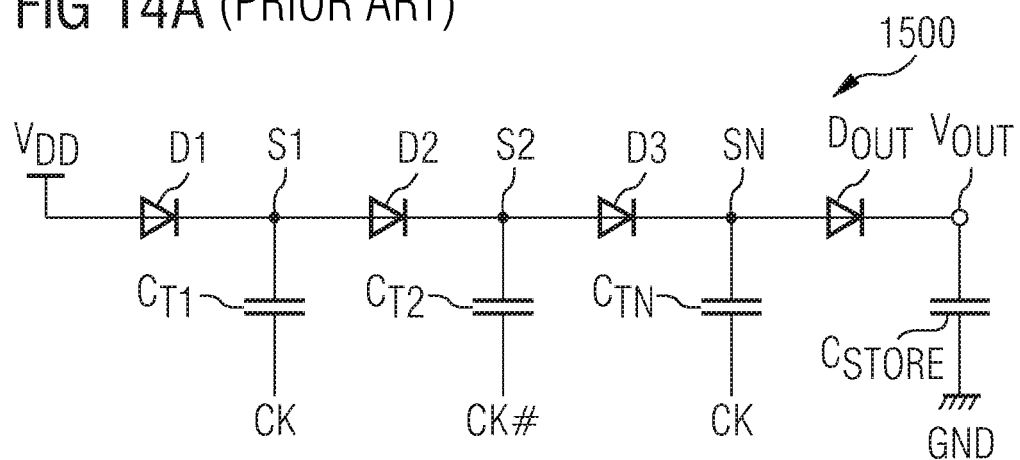
FIG. 14A illustrates a charge pump circuit.
Figure 14B:
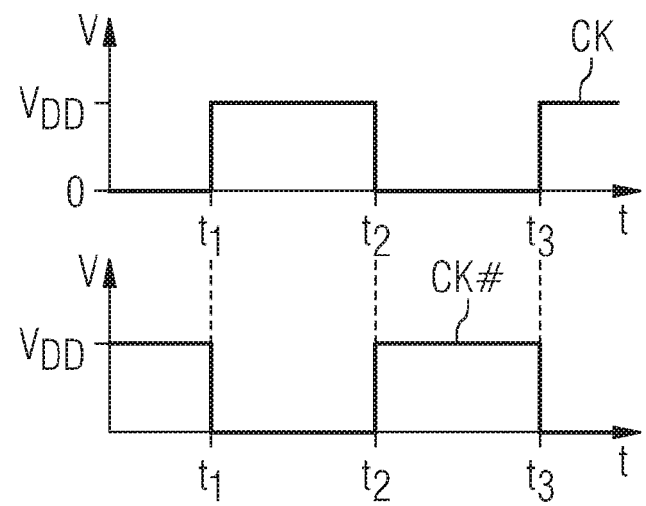
FIG. 14B illustrates a timing diagram of the charge pump circuit of FIG. 14A.
Figure 15A:
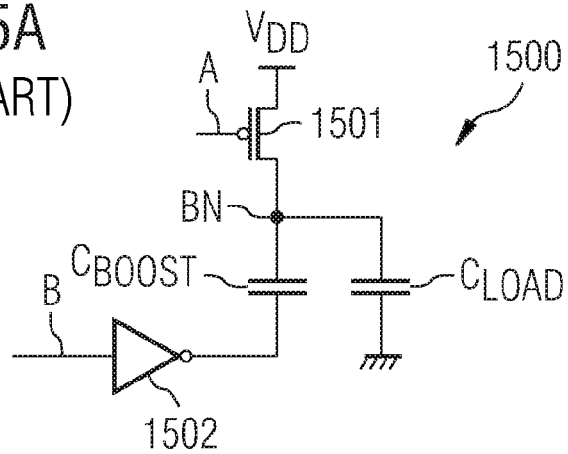
FIG. 15A illustrates a boosting circuit.
Figure 15B:
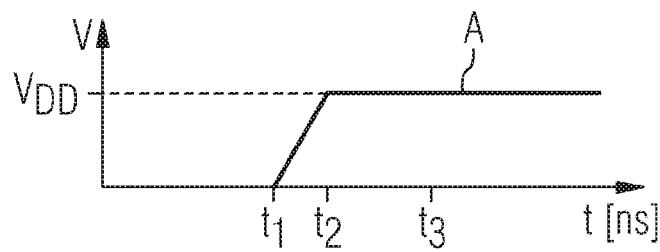
FIG. 15B illustrates a timing diagram of a first signal A that is applied to the boosting circuit of FIG. 15A.
Figure 15C:
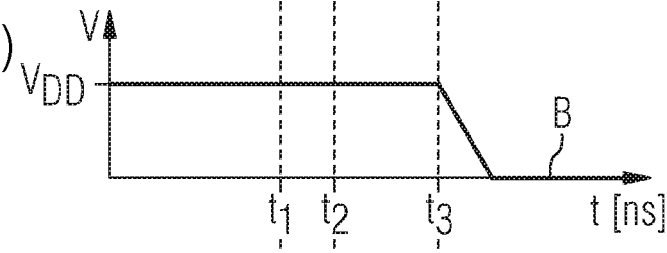
FIG. 15C illustrates a timing diagram of a second signal B that is applied to the boosting circuit of FIG. 15A.
Figure 15D:
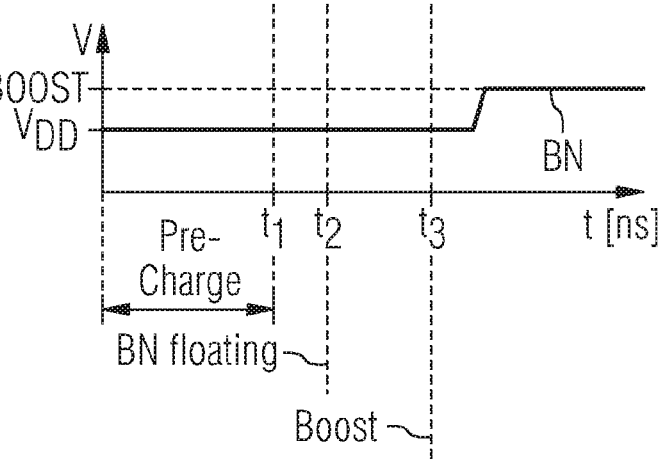
FIG. 15D illustrates a timing diagram of the voltage at node BN of the boosting circuit of FIG. 15A.

FIG. 13 shows a flash memory circuit 1300, wherein only the non-volatile memory array 1301 and a row and bitline decoder 1302 as well as the above-described voltage generator including the microprocessor 1202 and the power regulator 1201 are shown for reasons of simplicity.

The flash memory circuit 1300 further includes components that are provided in a flash memory circuit, for example drivers, column decoder, address mapping device, etc., which are not shown for reasons of simplicity.

In the preferred embodiment of the invention, the flash memory device includes non-volatile memory cells being selected from the group of: flash non-volatile memory cells, ferroelectric random access memory cells (FRAM cells), magnetoresistive random access memory cells (MRAM cells), phase change memory cells (PCM cells), conductive bridging random access memory cells (CB cells), and organic random access memory cells (Organic cells).

The invention can be used advantageously at least in a non-volatile memory device being selected from the group of: flash non-volatile memory cells, ferroelectric random access memory non-volatile memory device (FRAM), magnetic random access non-volatile memory device (MRAM), phase change memory non-volatile memory device (PCM), conductive bridging random access memory non-volatile memory device (CB RAM), and organic random access memory non-volatile memory device (Organic RAM).

The electronic memory device can be arranged as a floating gate flash non-volatile memory device or as a charge-trapping layer non-volatile memory device, for example as a nitride read only memory flash non-volatile memory device.

The flash memory cells can be designed as floating gate flash memory cell non-volatile memory cells or as charge-trapping layer flash non-volatile memory cells. The charge trapping layer flash non-volatile memory cells can include an oxide nitride oxide layer stack (ONO), wherein the charge carriers are trapped in the nitride interface between the lowermost silicon oxide layer and the nitride layer, which is sandwiched between the silicon oxide layers.

Alternatively, the charge-trapping layer can be made of aluminum oxide ($Al_2O_3$), yttrium oxide ($Y_2O_3$), lanthanum oxide ($LaO_2$), hafnium oxide ($HfO_2$), zirconium oxide ($ZrO_2$), amorphous silicon, tantalum oxide ($Ta_2O_5$), titanium oxide ($TiO_2$) and/or an aluminate. An example for an aluminate is an alloy of the components aluminum, zirconium and oxygen (Al, Zr, O).

In the following, examples for the achieved voltage gains according to different embodiments of the invention are given for different values for the voltages used and the capacitances used.

EXAMPLE 1 $V_a = V_{dd}$ $V_b = 0$ $V_c = V_{dd}$ $C_3 = C_2 = C_1$ $$V_{out\ final} = 2 \cdot V_{dd} + V_{dd} \cdot \frac{1}{3} + V_{dd} \cdot \frac{1}{2} = V_{dd} \cdot \frac{17}{6} = V_{dd} \cdot 2.83$$

As can be gathered from the above-described Example 1, the voltage gain in case of the three capacitances having the same capacitance values, and the first voltage $V_a$ being the power supply voltage $V_{DD}$, the second voltage being zero volts and the third voltage $V_c$ also being the power supply voltage $V_{DD}$ results in a voltage gain of $2.83 \cdot V_{DD}$.

EXAMPLE 2 $V_a = V_{dd}$ $V_b = 0$ $V_c = V_{dd}$ $C_3 = 2 \cdot C_2 = 4 \cdot C_1$ $$V_{out\ final} = 2 \cdot V_{dd} + V_{dd} \cdot \frac{4}{7} + V_{dd} \cdot \frac{2}{3} = V_{dd} \cdot \frac{68}{21} = V_{dd} \cdot 3.24$$

In case that the first capacitance $C_3$ value is twice as large as the value of the second capacitance $C_2$ (Example 2), which has in turn a capacitance value four times as large as the third capacitance $C_1$, the voltage gain will be (with the same voltages as according to Example 1) $3.24 \cdot V_{DD}$.

As described above it is to be emphasized that the voltage generator circuits can be used also with negative voltages to create negative high voltages.

Furthermore, in order to increase the voltage gain, as described above, more switching stages can be provided.

The following Example 3 shows the voltage gain for negative voltages, wherein the first voltage $V_a$ is set to zero volts, as well as the third voltage $V_c$, while the second voltage $V_b$ is set to the power supply voltage $V_{DD}$. The three capacitances $C_1$, $C_2$, $C_3$ have the same capacitance values. According to this example, the resulting voltage gain is $-1.83 \cdot V_{DD}$.

EXAMPLE 3 $V_a = 0$ $V_b = V_{dd}$ $C_3 = C_2 = C_1$ $V_{out\ final} = -1.83 V_{dd}$ In summary, the following embodiments of the invention should be mentioned.

The voltage generator circuit is very simple as compared to other charge pump circuits.

The voltage generator circuit provides the maximum output voltage in a very short time, since the maximum output voltage is reached immediately and not after a large number of clock cycles as with a charge pump circuit.

The voltage generator circuit does not need boosted phases, because the switching of the path-transistor can be done while level shifters are controlled by the same boosted internal voltage reducing the area occupation.

The output maximum voltage available is reached, since the beginning in one cycle against a common charge pump that must be charged itself. This makes the voltage generator circuit capable to be used like a super-booster (for positive voltages as well as for negative voltages) and increases the efficiency at the start up if used like a charge pump.

It should be appreciated by those skilled in the art, that the described processes may be implemented in hardware, software, firmware or a combination of these implementations as appropriate. For example, the operation of selecting a memory cell may be carried out by word and bit-line decoders under the control of an I/O interface unit such as a computer. Accordingly, the described operations may be implemented as executable instructions stored on a computer readable medium (removable disk, volatile or non-volatile memory, embedded processors, etc.), the stored instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A voltage generator circuit providing an output voltage that is higher than an input voltage, the voltage generator circuit comprising:
   an input terminal receiving the input voltage;
   an output terminal providing the output voltage;
   a pre-charge element coupled between the input terminal and the output terminal; and a capacitance circuit coupled to the input terminal and to the output terminal, the capacitance circuit comprising:
- a first capacitance;
- a first capacitance current pass element coupled between the output terminal and a first node of the first capacitance;
- a second capacitance;
- a second capacitance current pass element being connected between the output terminal and a first node of the second capacitance;
- a third capacitance, a first node of which being coupled to the output terminal; and
- a current pass and pre-charge element controller provided such that in a pre-charge phase, the current pass elements and the pre-charge element are closed, and in a voltage shifting phase, the pre-charge element is opened,
- wherein the capacitance current pass elements are controlled such that they are sequentially opened such that charge on the capacitances is transferred to a predetermined capacitance of the capacitance circuit, which then provides the output voltage, wherein, before a capacitance current pass element is opened, a respective capacitance, the first node of which is coupled to the capacitance current pass element to be opened, is provided with a boost voltage at its second node.

2. The voltage generator circuit of claim 1, wherein the capacitance circuit further comprises:
- at least a fourth capacitance; and
- at least a third capacitance current pass element coupled between the output terminal and a first node of the fourth capacitance.

3. The voltage generator circuit of claim 1, wherein the first, second, and third capacitances have substantially the same capacitance value.

4. The voltage generator circuit of claim 1, wherein the first, second, and third capacitances do not all have the same capacitance values.

5. The voltage generator circuit of claim 1, wherein the pre-charge element comprises a pre-charge switching element.

6. The voltage generator circuit of claim 1, wherein the pre-charge element comprises at least one transistor.

7. The voltage generator circuit of claim 1, wherein the pre-charge element comprises at least one of a field effect transistor, a transmission gate, or a diode.

8. The voltage generator circuit of claim 1, wherein the pre-charge element comprises at least one metal oxide semiconductor field effect transistor.

9. The voltage generator circuit of claim 1, wherein the pre-charge element comprises at least one p-channel metal oxide semiconductor field effect transistor.

10. The voltage generator circuit of claim 1, wherein at least one of the capacitance current pass elements comprises a capacitance switching element.

11. The voltage generator circuit of claim 1, at least one of the capacitance current pass elements comprises at least one of a transistor, a transmission gate, or a diode.

12. The voltage generator circuit of claim 1, wherein at least one of the capacitance current pass elements comprises at least one field effect transistor.

13. The voltage generator circuit of claim 1, wherein at least one of the capacitance current pass elements comprises at least one metal oxide semiconductor field effect transistor.

14. The voltage generator circuit of claim 1, wherein at least one of the capacitance current pass elements comprises at least one p-channel metal oxide semiconductor field effect transistor.

15. The voltage generator circuit of claim 1, further comprising:
- a first level shifter circuit coupled between the current pass and pre-charge element controller and the first capacitance current pass element.

16. The voltage generator circuit of claim 1, further comprising:
- a second level shifter circuit coupled between the current pass and pre-charge element controller and the second capacitance current pass element.

17. The voltage generator of claim 1, wherein the voltage generator is one component of an electronic memory device.

18. The voltage generator device of claim 17, wherein the electronic memory device comprises a non-volatile memory device.

19. The voltage generator of claim 18, wherein the electronic memory device comprises a non-volatile memory device being selected from the group of:
- a flash non-volatile memory device;
- a ferroelectric random access memory non-volatile memory device;
- a magnetic random access memory non-volatile memory device;
- a phase change memory non-volatile memory device;
- a conductive bridging random access memory non-volatile memory device; and
- an organic random access memory non-volatile memory device.

20. The voltage generator of claim 17, wherein the electronic memory device comprises a floating gate flash non-volatile memory device or a charge-trapping layer flash non-volatile memory device.

21. The voltage generator of claim 20, wherein the electronic memory device comprises a nitride read only memory flash non-volatile memory device.

22. A voltage generator circuit providing an output voltage that is higher than an input voltage, the voltage generator circuit comprising:
- an input terminal receiving the input voltage;
- an output terminal providing the output voltage;
- a pre-charge switching element coupled between the input terminal and the output terminal; and
- a capacitance circuit coupled to the input terminal and to the output terminal, the capacitance circuit comprising:
  - a first capacitance;
  - a first capacitance switching element coupled between the output terminal and a first node of the first capacitance;
  - a second capacitance;
  - a second capacitance switching element coupled between the output terminal and a first node of the second capacitance;
  - a third capacitance, a first node of which is coupled to the output terminal; and
  - a switching element controller provided such that in a pre-charge phase, the switching elements are closed, and in a voltage shifting phase, the pre-charge switching element is opened,
  - wherein the capacitance switching elements are controlled such that they are sequentially opened such that charge on the capacitances is transferred to a predetermined capacitance of the capacitance circuit, which then provides the output voltage, wherein, before a capacitance switching element is opened, a respective capacitance, the first node of which is coupled to the capacitance switching element to be opened, is provided with a boost voltage at its second node.

23. A method of providing an output voltage that is higher than a received input voltage, the method comprising:
   providing a voltage generator circuit, the voltage generator circuit comprising:
      an input terminal receiving the input voltage;
      an output terminal providing the output voltage;
      a pre-charge element coupled between the input terminal and the output terminal;
      a capacitance circuit coupled to the input terminal and to the output terminal, comprising:
         a first capacitance;
         a first capacitance current pass element coupled between the output terminal and a first node of the first capacitance;
         a second capacitance;
         a second capacitance current pass element coupled between the output terminal and a first node of the second capacitance;
         a third capacitance, a first node of which is coupled to the output terminal, closing each of the current pass elements and the pre-charge element, thereby pre-charging the capacitances with the input voltage;
   opening the pre-charge element; and
   sequentially opening the capacitance current pass elements such that charge on the capacitances is transferred to a predetermined capacitance of the capacitance circuit, which then provides the output voltage, wherein, before a capacitance current pass element is opened, a respective capacitance, the first node of which is coupled to the capacitance current pass element to be opened, is provided with a boost voltage at its second node.

* * * * *

UNITED STATES PATENT AND TRADEMARK OFFICE
CERTIFICATE OF CORRECTION

PATENT NO. : 7,355,468 B2  Page 1 of 1
APPLICATION NO. : 11/473519
DATED : April 8, 2008
INVENTOR(S) : de Ambroggi et al.

It is certified that error appears in the above-identified patent and that said Letters Patent is hereby corrected as shown below:

In Col. 5, line 27, after of, delete "with".
In Col. 5, line 27, after accordance, insert --with--.
In Col. 13, line 24, after EXAMPLE 1, delete "$V_a=V_{dd}$".
In Col. 13, line 25, insert --$V_a=V_{dd}$--.
In Col. 13, line 45, after EXAMPLE 2, delete "$V_a=V_{dd}$".
In Col. 13, line 46, insert --$V_a=V_{dd}$--.
In Col. 14, line 9, after EXAMPLE 3, delete "$V_a=0$".
In Col. 14, line 10, insert --"$V_a=0$"--.
In Col. 14, line 12, insert --"$V_c=0$"--.

Signed and Sealed this

Twenty-second Day of July, 2008

JON W. DUDAS
*Director of the United States Patent and Trademark Office*